(12) United States Patent
Kim et al.

(10) Patent No.: US 11,658,010 B2
(45) Date of Patent: May 23, 2023

(54) SUBSTRATE SUPPORT UNIT AND SUBSTRATE PROCESSING APPARATUS INCLUDING THE SAME

(71) Applicant: SEMES CO., LTD., Chungcheongnam-do (KR)

(72) Inventors: Dae Hyun Kim, Daejeon (KR); Sae Won Na, Chungcheongbuk-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 16/986,444

(22) Filed: Aug. 6, 2020

(65) Prior Publication Data

US 2021/0057187 A1 Feb. 25, 2021

(30) Foreign Application Priority Data

Aug. 21, 2019 (KR) .................. 10-2019-0102197

(51) Int. Cl.
*H01J 37/32* (2006.01)
*H01L 21/67* (2006.01)
*H01L 21/683* (2006.01)

(52) U.S. Cl.
CPC .... *H01J 37/32183* (2013.01); *H01J 37/3244* (2013.01); *H01J 37/32642* (2013.01);
(Continued)

(58) Field of Classification Search
None
See application file for complete search history.

(56) References Cited

U.S. PATENT DOCUMENTS

| 9,076,831 | B2 | 7/2015 | Drewery | |
| 2008/0236492 | A1* | 10/2008 | Yamazawa | H01J 37/32183 118/723 I |
| 2008/0236493 | A1* | 10/2008 | Sakao | H01J 37/32091 118/723 I |

(Continued)

FOREIGN PATENT DOCUMENTS

| JP | 2010183074 A | 8/2010 |
| KR | 20110025686 A | 3/2011 |

(Continued)

OTHER PUBLICATIONS

English Machine translation of IDS art Lee KR-2017039978-A retrieved from ESPACENET on Dec. 14, 2021 (Year: 2022).*

(Continued)

*Primary Examiner* — Ram N Kackar
*Assistant Examiner* — Laureen Chan
(74) *Attorney, Agent, or Firm* — RatnerPrestia

(57) ABSTRACT

Provided are a substrate support unit capable of controlling a gradient between a center zone and an edge zone by adjusting impedances of center and edge electrodes constituting a lower electrode in a process chamber, and a substrate processing apparatus including the same. The substrate processing apparatus includes a housing, a shower head unit introduce a process gas for processing a substrate into the housing, and a support unit having an electrostatic chuck on which the substrate is mounted. The electrostatic chuck includes a dielectric plate constituting a body, a first heater configured to heat a first zone of the dielectric plate, and a second heater configured to heat a second zone of the dielectric plate. An etch rate for each zone of the substrate is controlled by adjusting an impedance or a voltage applied to each of the first heater and the second heater.

8 Claims, 7 Drawing Sheets

(52) U.S. Cl.
CPC .. *H01J 37/32715* (2013.01); *H01J 37/32724* (2013.01); *H01L 21/67069* (2013.01); *H01L 21/67103* (2013.01); *H01L 21/6833* (2013.01); *H01J 2237/334* (2013.01)

(56) References Cited

U.S. PATENT DOCUMENTS

| | | | | |
|---|---|---|---|---|
| 2009/0133839 A1* | 5/2009 | Yamazawa | ........ | H01J 37/32724 156/345.48 |
| 2015/0235809 A1* | 8/2015 | Ito | ............................ | H05H 1/46 156/345.48 |
| 2018/0342375 A1* | 11/2018 | Nguyen | ............ | H01J 37/32174 |
| 2020/0090907 A1* | 3/2020 | Kim | .................. | H01J 37/32724 |

FOREIGN PATENT DOCUMENTS

| | | | | |
|---|---|---|---|---|
| KR | 101292605 B1 | | 8/2013 | |
| KR | 20140097307 A | | 8/2014 | |
| KR | 20140141286 A | | 12/2014 | |
| KR | 20170025459 A | | 3/2017 | |
| KR | 2017039978 A | * | 4/2017 | ........ H01J 37/32082 |
| KR | 20170039978 A | | 4/2017 | |
| KR | 20190033672 A | | 4/2019 | |
| KR | 20190050656 A | | 5/2019 | |

OTHER PUBLICATIONS

Korean Office Action issued in Korean Patent Application No. 10-2019-0102197, dated Nov. 12, 2020, 5 pages.

Korean Notification of Reason for Refusal issued in Korean Patent Application No. 10-2021-0106912, dated Aug. 27, 2021, with translation, 10 pages.

Korean Grant of Patent issued in Korean Patent Application No. 10-2021-0106912, dated Apr. 20, 2022, 4 pages, with English translation.

* cited by examiner

[FIG. 1]
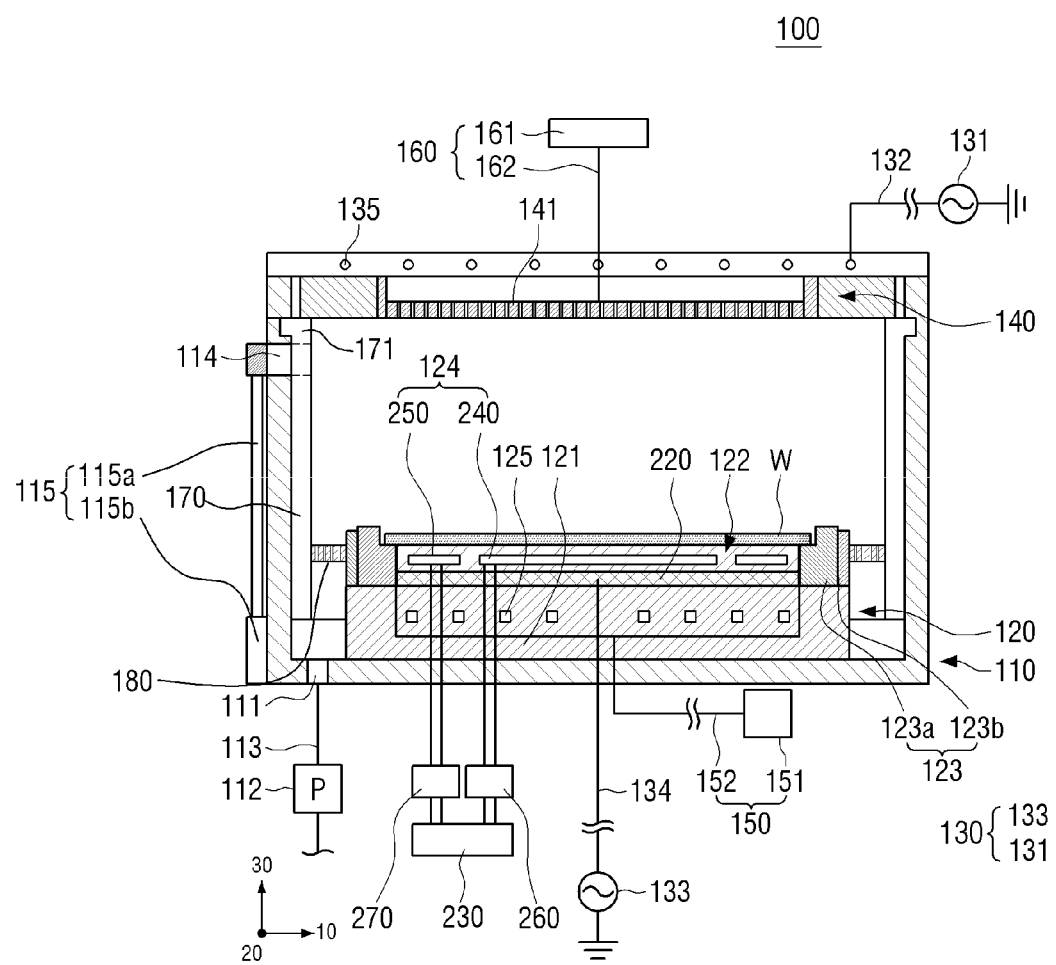

[FIG. 2]
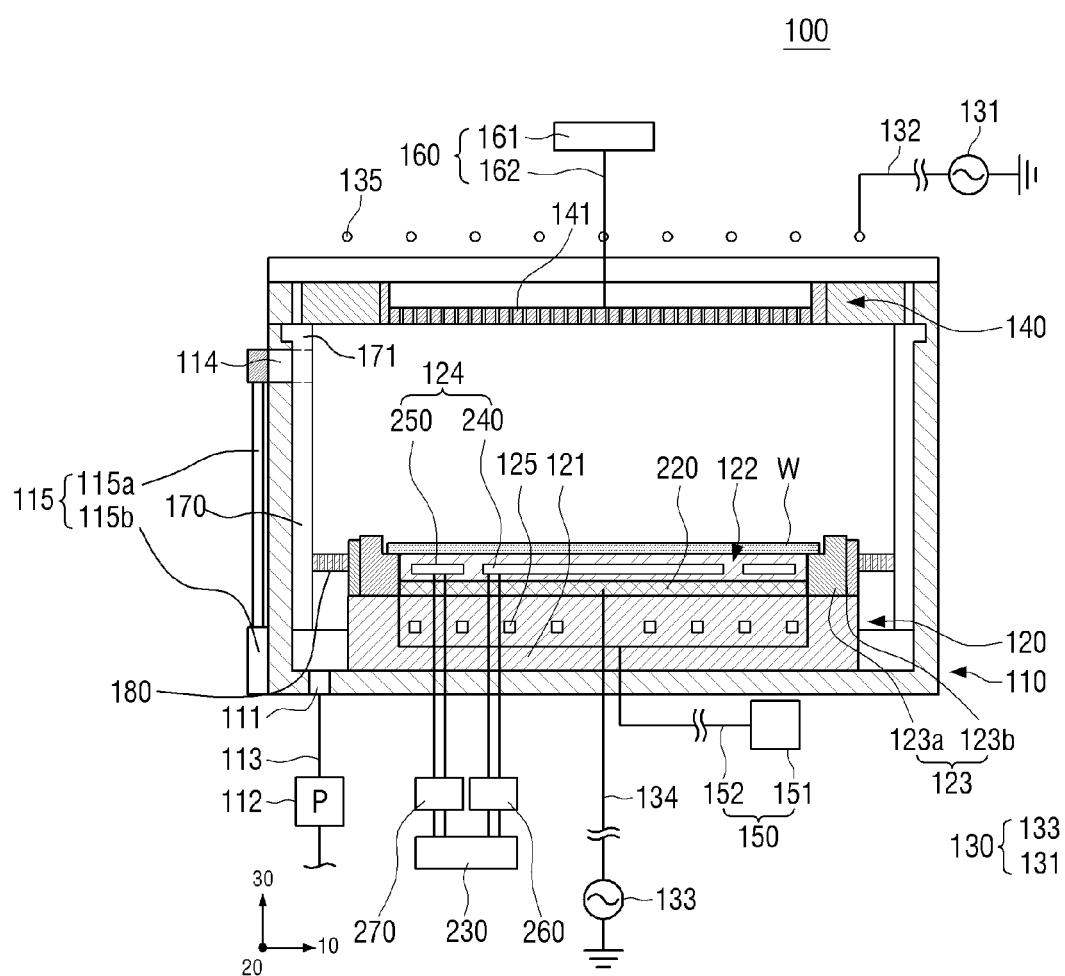

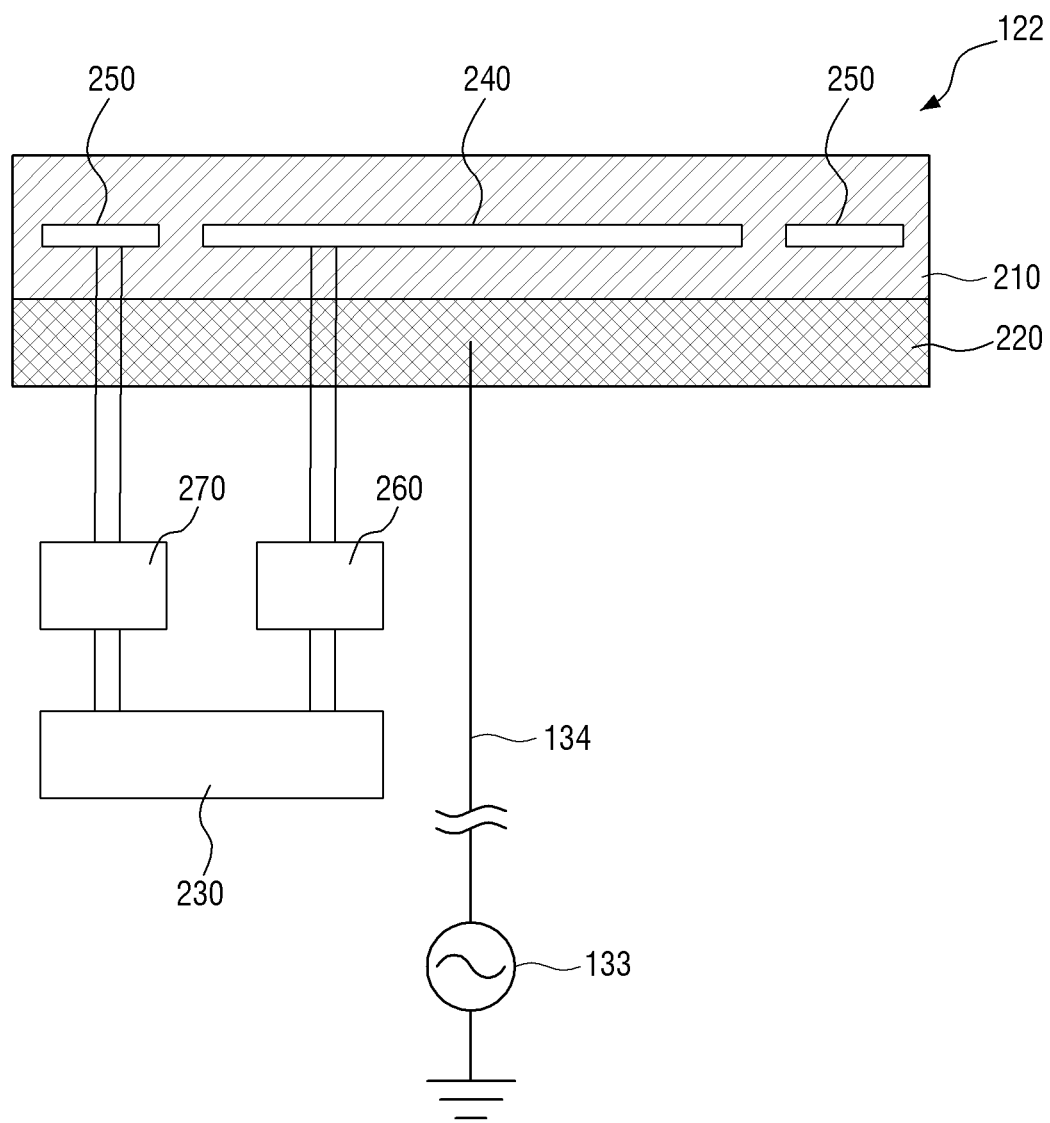
[FIG. 3]

[FIG. 4]
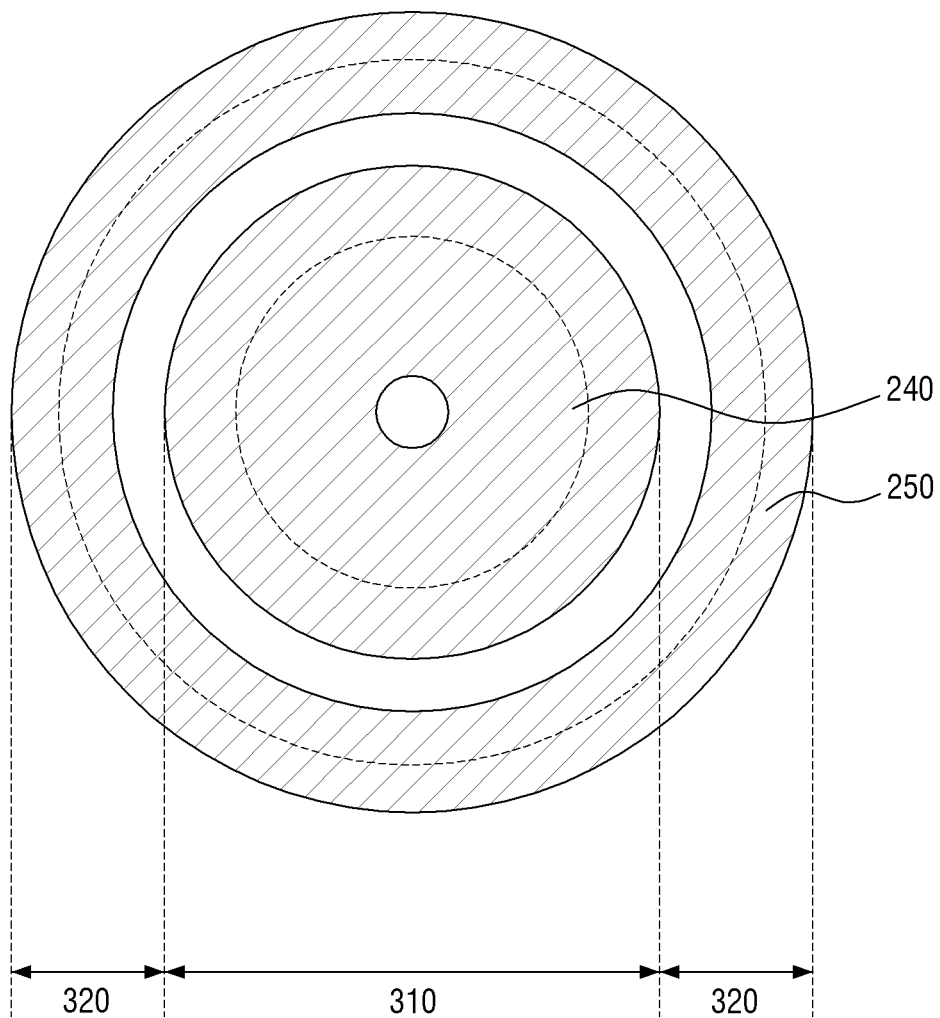

[FIG. 5]
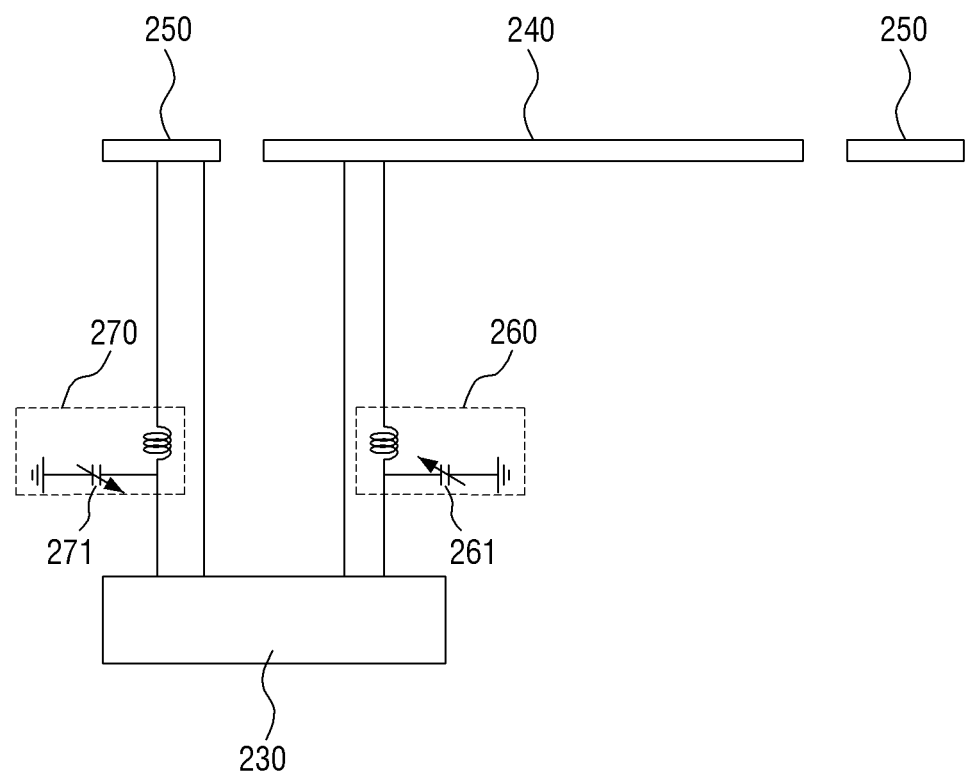

[FIG. 6]
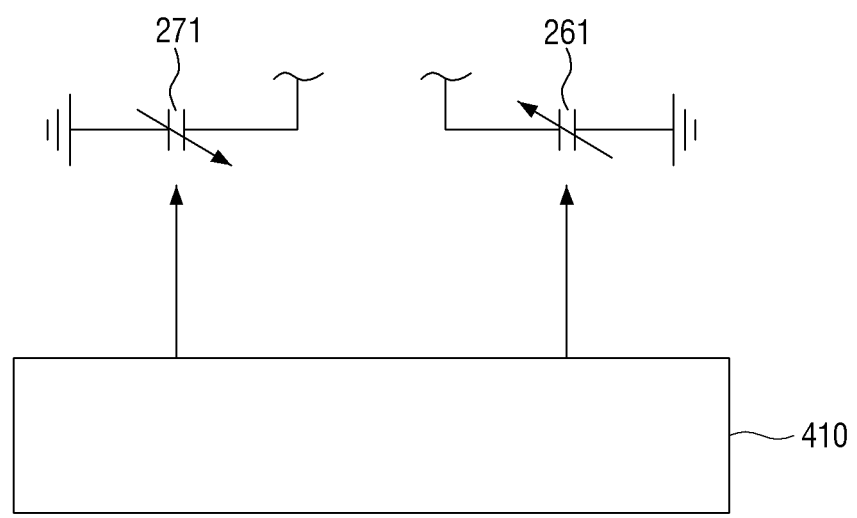

[FIG. 7]
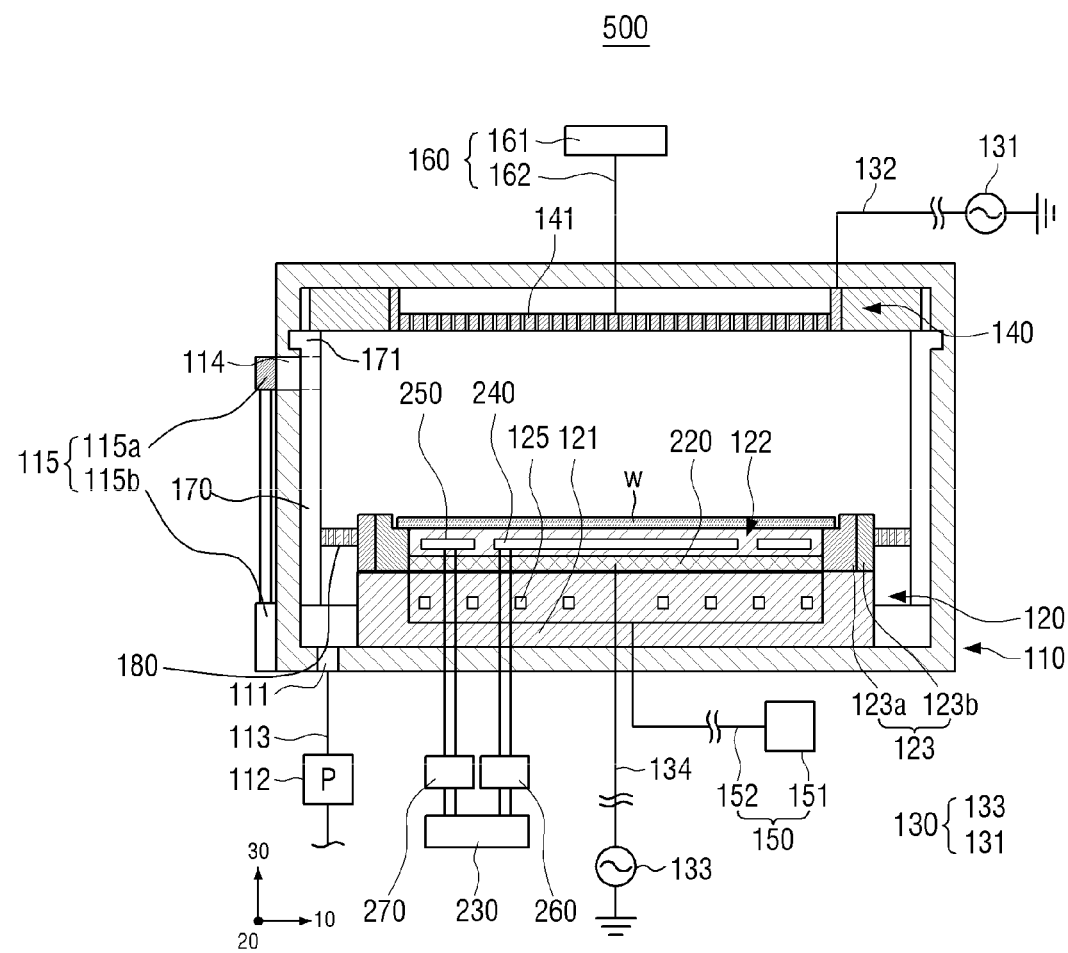

SUBSTRATE SUPPORT UNIT AND SUBSTRATE PROCESSING APPARATUS INCLUDING THE SAME

CROSS-REFERENCE TO RELATED APPLICATION

This application claims priority from Korean Patent Application No. 10-2019-0102197 filed on Aug. 21, 2019 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate support unit and a substrate processing apparatus including the same. More particularly, the present disclosure relates to a substrate support unit equipped with an electrostatic chuck for use as a lower electrode and a substrate processing apparatus including the same.

2. Description of the Related Art

A semiconductor device may be manufactured by forming a predetermined pattern on a substrate. The predetermined pattern is formed on the substrate in such a way of performing a plurality of processes including a depositing process, a lithography process, and an etching process in series in facility for the semiconductor manufacturing process.

The plasma process for use in manufacturing a semiconductor device may be performed in a process chamber.

In the process chamber, however, the etch rate may increase in the edge zone of the substrate (e.g., wafer) as the RF time increases. This may cause inconvenience of periodic replacement of relevant parts (e.g., focus ring), incur heavy expenses for maintenance of the facility, and shorten the usage cycle of the facility.

SUMMARY

Aspects of the present disclosure provide a substrate support unit that is capable of controlling a gradient between a center zone and an edge zone by adjusting impedances of center and edge electrodes constituting a lower electrode in the process chamber.

Aspects of the present disclosure also provide a substrate processing apparatus equipped with a substrate support unit that is capable of controlling a gradient between a center zone and an edge zone by adjusting impedances of center and edge electrodes constituting a lower electrode in the process chamber.

However, aspects of the present invention are not restricted to those set forth herein. The above and other aspects of the present invention will become more apparent to one of ordinary skill in the art to which the present invention pertains by referencing the detailed description of the present invention given below.

According to an aspect of the present disclosure, there is provided a substrate processing apparatus comprising: a housing; a shower head unit installed on an upper side inside the housing to introduce a process gas for processing a substrate into the housing; and a support unit installed on a lower side inside the housing, the support unit having an electrostatic chuck on which the substrate is mounted; wherein the electrostatic chuck includes: a dielectric plate constituting a body; a first heater configured to heat a first zone of the dielectric plate; and a second heater configured to heat a second zone of the dielectric plate, and wherein an etch rate for each zone of the substrate is controlled by adjusting an impedance or a voltage applied to each of the first heater and the second heater.

The electrostatic chuck may include a first capacitor connected to the first heater; and a second capacitor connected to the second heater, and the etch rate for each zone may be controlled by adjusting a capacitance of the first capacitor and a capacitance of the second capacitor.

At least one of the first capacitor or the second capacitor may be a variable capacitor The electrostatic chuck may further include a first filter installed between an alternating current (AC) power source and the first heater to eliminate a noise signal flowing from the first heater to the AC power source; and a second filter installed between the AC power source and the second heater to eliminate a noise signal flowing from the second heater to the AC power source, and the first capacitor and the second capacitor may be respectively connected to the first heater and the second heater through the first filter and the second filter.

When the first zone of the substrate has an etch rate higher than that of the second zone of the substrate, the capacitance of the first capacitor may be decreased or the capacitance of the second capacitor may be increased to control the etch rate for each zone, and when the second zone of the substrate has an etch rate higher than that of the first zone of the substrate, the capacitance of the first capacitor may be increased or the capacitance of the second capacitor may be decreased to control the etch rate for each zone.

The electrostatic chuck may further include a controller which adjusts an impedance or a voltage applied to each of the first heater and the second heater based on the etch rate for each zone.

According to another aspect of the present disclosure, there is provided a substrate support unit comprising: an electrostatic chuck on which a substrate to be etched using plasma is mounted; a base installed under the electrostatic chuck to support the electrostatic chuck; and a ring assembly installed on a side surface of the electrostatic chuck and allowing plasma to concentrate on the substrate; wherein the electrostatic chuck includes: a dielectric plate constituting a body; a first heater configured to heat a first zone of the dielectric plate; and a second heater configured to heat a second zone of the dielectric plate, and wherein an etch rate for each zone of the substrate is controlled by adjusting an impedance or a voltage applied to each of the first heater and the second heater.

According to a further aspect of the present disclosure, there is provided a substrate processing apparatus comprising: a housing; a shower head unit installed on an upper side inside the housing to introduce a process gas for processing a substrate into the housing; and a support unit installed on a lower side inside the housing, the support unit having an electrostatic chuck on which the substrate is mounted; wherein the electrostatic chuck includes: a dielectric plate including a first heater configured to heat a first zone of the dielectric plate and a second heater configured to heat a second zone of the dielectric plate; and a lower electrode to which RF power is applied, and the substrate processing apparatus further comprising: a lower power source applying the RF power to the lower electrode; a first filter including a first variable capacitor; a second filter including a second variable capacitor; an alternating current (AC)

power source configured to provide a first AC signal to the first heater through the first filter and to provide a second AC signal to the second heater through the second filter; and a controller configured to adjust at least one of capacitances of the first variable capacitor and the second variable capacitor.

At least one of impedances of a center zone and an edge zone of the lower electrode may be adjusted as the at least one of the capacitances of the first variable capacitor and the second variable capacitor is adjusted by the controller.

An etch rate for each zone of the substrate may be controlled as the at least one of the capacitances of the first variable capacitor and the second variable capacitor is adjusted by the controller.

The controller may adjust the at least one of the capacitances of the first variable capacitor and the second temporary capacitor based on the etch rate.

The first filter may be installed between the AC power source and the first heater to eliminate a noise signal flowing from the first heater to the AC power source, and the second filter may be installed between the AC power source and the second heater to eliminate a noise signal flowing from the second heater to the AC power source.

BRIEF DESCRIPTION OF THE DRAWINGS

The above and other aspects and features of the present invention will become more apparent by describing in detail exemplary embodiments thereof with reference to the attached drawings, in which:

FIG. 1 is a cross-sectional view schematically illustrating a configuration of a substrate processing apparatus equipped with a substrate support unit according to an embodiment of the disclosure;

FIG. 2 is a cross-sectional view schematically illustrating a configuration of a substrate processing apparatus according to another embodiment;

FIG. 3 is a cross-sectional view schematically illustrating a configuration of an electrostatic chuck according to an embodiment of the present disclosure;

FIG. 4 is a plan view schematically illustrating a heating member constituting an electrostatic chuck according to an embodiment of the present disclosure;

FIG. 5 is a first exemplary view for explaining a method for controlling a gradient between a center zone and an edge zone of a substrate according to an embodiment of the present disclosure;

FIG. 6 is a second exemplary view for explaining a method for controlling a gradient between a center zone and an edge zone of a substrate according to another embodiment of the disclosure; and FIG. 7 is a cross-sectional view schematically illustrating a configuration of the substrate processing apparatus according to another embodiment.

DETAILED DESCRIPTION OF THE EMBODIMENTS

Hereinafter, preferred embodiments of the present disclosure will be described in detail with reference to the accompanying drawings. Advantages and features of the present disclosure and methods of accomplishing the same may be understood more readily by reference to the following detailed description of preferred embodiments and the accompanying drawings. The present disclosure may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

Unless defined otherwise, all technical and scientific terms used herein have the same meaning as commonly understood by one of ordinary skill in the art to which this invention belongs. Further, unless defined otherwise, all terms defined in generally used dictionaries may not be overly interpreted.

Hereinafter, exemplary embodiments of the present disclosure will be described in detail with reference to the accompanying drawings. In the description with reference to the drawings, the same or corresponding elements are denoted by the same reference numerals, and a redundant description thereof will be omitted.

In a process chamber for performing a dry etching process, the etch speed (etch rate) may increase in the edge zone of the substrate (e.g., wafer) as the RF time increases. There is therefore a need of controlling a change in gradient between the center zone and the edge zone of the substrate.

The present disclosure relates to a substrate support unit for controlling a gradient between a center zone and an edge zone of a substrate by adjusting impedances of center and edge electrodes constituting a lower electrode in a process chamber. A description is hereinafter made of the present disclosure with reference to accompanying drawings.

FIG. 1 is a cross-sectional view schematically illustrating a configuration of a substrate processing apparatus equipped with a substrate support unit according to an embodiment of the disclosure.

As shown in FIG. 1, a substrate processing apparatus 100 may include a housing 110, a support unit 120, a plasma generation unit 130, a shower head unit 140, a first gas supply unit 150, a second gas supply unit 160, a liner 170, and a baffle unit 180.

The substrate processing apparatus 100 may be a system for processing the substrate W with a dry etching process and may be referred to as a substrate processing apparatus. The substrate processing apparatus 100 may process the substrate W, for example, with a plasma process.

The housing 110 may provide a space for performing the plasma process. The housing 110 may be provided with an exhaust hole 111 on the bottom part thereof.

The exhaust hole 111 may be connected to an exhaust line 113 on which a pump 112 is mounted. The exhaust hole 111 may exhaust the reaction by-products produced during the plasma process and the gas remaining inside the housing 110 to the outside of the housing 110 through the exhaust line 113. In this case, the inner space of the housing 110 may be decompressed to a predetermined pressure.

The housing 110 may have an opening 114 formed on a sidewall thereof. The opening 114 may function as a passage through which the substrate W enters and exits the housing 110. The opening 114 may be configured to be opened and closed by a door assembly 115.

The door assembly 115 may include an outer door 115a and a door driver 115b. The outer door 115a may be formed on the outer wall of the housing 110. The outer door 115a may move in an up-down direction (i.e., third direction 30) by means of the door driver 115b. The door driver 115b may be driven by a motor, a hydraulic cylinder, a pneumatic cylinder, or the like.

The support unit 120 may be mounted on the bottom area inside the housing 110. The support unit 120 may support the substrate W using an electrostatic force. However, this embodiment is not limited thereto. The support unit 120 may support the substrate W in various manners such as using mechanical clamping or vacuum.

In the case where the support unit 120 uses the electrostatic force for supporting the substrate W, the support unit 120 may include a base 121, an electrostatic chuck 122, a ring assembly 123, a heating member 124, and a cooling member 125.

The electrostatic chuck (ESC) 122 may support the substrate mounted on the upper part thereof using the electrostatic force. The electrostatic chuck 122 may be made of a ceramic material and fixedly connected onto the base 121.

The electrostatic chuck 122 may control the gradient between the center zone and the edge zone of the substrate W by adjusting the impedances of the center and edge electrodes constituting the lower electrode inside the housing 110. This may make it possible, in this embodiment, to increase the usage cycle of the facility and reduce maintenance costs. Such characteristics of the electrostatic chuck 122 are described later with reference to the accompanying drawings.

Meanwhile, the electrostatic chuck 122 may be mounted so as to move in the up-down direction (i.e., third direction 30) inside the housing 110 by means of a driving member (not shown). In the case where the electrostatic chuck 122 is mounted so as to move in the up-down direction, it may be possible to locate the substrate W at a position at which the plasma distribution is more uniform.

The ring assembly 123 may be arranged to surround the edge of the electrostatic chuck 122. The ring assembly 123 has a ring shape and may be configured to support the edge zone of the substrate W. The ring assembly 123 may include a focus ring 123a and an insulation ring 123b.

The focus ring 123a may be arranged inside the insulation ring 123b to surround the electrostatic chuck 122. The focus ring 123a may be made of a silicon material and may concentrate plasma on the substrate W.

The insulation ring 123b may be arranged outside the focus ring 123a to surround the focus ring 123a. The insulation ring 123b may be made of a quartz material.

Meanwhile, the ring assembly 123 may further include an edge ring that is tightly adjoined to the edge of the focus ring 123a. The edge ring may be formed to prevent the side surface of the electrostatic chuck 122 from being damaged by the plasma.

The heating member 124 and the cooling member 125 may be provided for the substrate W to maintain a process temperature during the etching process in the housing 110. For this purpose, the heating member 124 may be provided in the form of a heat line, and the cooling member 125 may be provided in the form of a cooling line in which a refrigerant is flowing.

The heating member 124 and the cooling member 125 may be installed inside the support unit 120 in order for the substrate W to maintain the process temperature. For example, the heating member 124 may be installed in the inside of the electrostatic chuck 122, and the cooling member 125 may be installed in the inside of the base 121.

The first gas supply unit 150 may supply gas for removing foreign substances remaining on top of the ring assembly 123 and around the edge of the electrostatic chuck 122. The first gas supply unit 150 may include a first gas supply source 151 and a first gas supply line 152.

The first gas supply source 151 may supply nitrogen ($N_2$) gas for removing the foreign substances. However, this embodiment is not limited thereto. The first gas supply source 151 may supply different gas or a cleansing agent.

The first gas supply line 152 may be arranged between the electrostatic chuck 122 and the ring assembly 123. The first gas supply line 152 may be arranged to as to be connected between the electrostatic chuck 122 and the focus ring 123a.

The first gas supply line 152 may also be arranged inside the focus ring 123a and bent to be connected through the electrostatic chuck 122 and the focus ring 123a.

The plasma generation unit 130 may generate plasma with the gas remaining in a discharging space. Here, the discharging space may mean a space located above the support unit 120 in the inner space of the housing 110.

The plasma generation unit 130 may generate plasma in the discharging space inside the housing 100 with an inductively coupled plasma (ICP) source. In this case, the plasma generation unit 130 may use an antenna 135 mounted on the upper part of the housing 110 as the upper electrode and the electrostatic chuck 122 as the lower electrode.

However, the present disclosure is not limited thereto. The plasma generation unit 130 may also generate plasma in the discharging space inside the housing 110 using a capacitively coupled plasma (CCP) source. In this case, the plasma generation unit 130 may use the shower head unit 140 installed inside the housing 110 as the upper electrode and the electrostatic chuck 122 as the lower electrode.

A description is made of the configuration of the substrate processing apparatus 500, in the case where the plasma generation unit 130 uses the capacitively coupled plasma (CCP) source, later with reference to accompanying drawings.

The plasma generation unit 130 may include an upper electrode, a lower electrode, an upper power source 131, and a lower power source 133.

The upper power source 131 may apply power to the upper electrode. The upper power source 131 may act as a plasma source for generating plasma and control the characteristics of the plasma in cooperation with the lower power source 133.

Although a single upper power source 131 is shown in FIG. 1, it may also be possible that a plurality of upper power sources are arranged in this embodiment. In the case where a plurality of upper power sources are arranged, the substrate processing apparatus 100 may further include a first matching network (not shown) that is electrically connected to the plurality of upper power sources.

The first matching network may perform matching on the frequency powers having different magnitudes from the respective upper power sources and apply the frequency powers to the shower head unit 140.

Meanwhile, a first impedance matching circuit (not shown) may be arranged on a first transmission line 132 connecting the upper power source 131 and the antenna 135 for the purpose of impedance matching.

The first impedance matching circuit may operate as a lossless passive circuit for effectively (i.e., maximally) transferring the electric energy from the upper power source 131 to the antenna 135.

The lower power source 133 may apply power to the lower electrode. The lower power source 133 may produce a sheath voltage accelerating ions to give bombardment to the substrate W, which leads to the improvement of anisotropic etching.

Although a single lower power source 133 is shown in FIG. 1, it may also be possible that a plurality of lower power sources 133 is arranged in this embodiment in the same manner as the upper power source 131. In the case where a plurality of lower power sources are arranged, the substrate processing apparatus 100 may further include a second matching network (not shown) that is electrically connected to the plurality of lower power sources.

The second matching network may perform matching on the frequency powers having different magnitudes from the respective lower power sources and apply the frequency powers to the electrostatic chuck 122.

Meanwhile, a second impedance matching circuit (not shown) may be arranged on a second transmission line 134 connecting the lower power source 133 and the electrostatic chuck 122 for the purpose of impedance matching.

The second impedance matching circuit may operate as a lossless passive circuit, in the same manner as the first impedance matching circuit, for effectively (i.e., maximally) transferring the electric energy from the lower power source 133 to the electrostatic chuck 122.

As described above, in the case where the plasma generation unit 130 uses the inductively coupled plasma (ICP) source, it may be possible to use the antenna 135 as the upper electrode and the electrostatic chuck 122 as the lower electrode. Here, the upper power source 131 may apply power to the antenna 135.

The antenna 135 may act as the upper electrode and may be mounted in the upper part of the housing 110.

The antenna 135 is provided with a coil forming a closed loop. The antenna 135 may produce a magnetic field and an electric field inside the housing 100 based on the power supplied from the upper power source 131 to excite the gas, which is flown into the inside of the housing 110 through the shower head unit 140, into plasma.

The antenna 135 may be provided with a coil having a planar spiral shape. However, this embodiment is not limited thereto. It is obvious to those skilled in the art that the coil can be modified variously in structure and size.

Meanwhile, the antenna 135 may be installed outside the housing 100 in separation from the housing 110. For example, the antenna may be installed above the housing as shown in FIG. 2. FIG. 2 is a cross-sectional view schematically illustrating a configuration of a substrate processing apparatus according to another embodiment.

The shower head unit 140 may be installed so as to face the electrostatic chuck 122 in the up-down direction inside the housing 110. The shower head unit 140 may be provided with a plurality of gas feeding holes 141 for feeding gas into the inside of the housing and it may have a diameter greater than that of the electrostatic chuck 122.

Meanwhile, the shower head unit 140 may be made of a silicon material or metal material.

The second gas supply unit 160 may supply the process gas into the inside of the housing 110 through the shower head unit 140. The second gas supply unit 160 may include a second gas supply source 161 and a second gas supply line 162.

The second gas supply source 161 may supply etching gas as the process gas for use in processing the substrate W. The second gas supply source 161 may supply the gas including fluorine components (e.g., $SF_6$ gas and $CF_4$ gas) as the etching gas.

It may be possible that a single second gas supply source 161 is arranged for supplying the etching gas to the shower head unit 140. However, this embodiment is not limited thereto. It may also be possible that a plurality of second gas supply sources 161 are arranged for supplying the process gas to the shower head unit 140.

The second gas supply line 162 may connect the second gas supply source 161 and the shower head unit 140. The second gas supply line 162 may allow the process gas being supplied by the second gas supply source 161 to flow to the shower head unit 140 such that the etching gas flows into the inside of the housing 110.

Meanwhile, in the case where the shower head unit 140 is divided into a center zone, a middle zone, and an edge zone, the second gas supply unit 160 may further include a gas distributer (not shown) and a gas distribution line (not shown) for supplying the process gas to the respective zones of the shower head unit 140.

The gas distributer may distribute the process gas being supplied from the second gas supply source 161 to the respective zones of the shower head unit 140. The gas distributer may be connected to the second gas supply source 161 through the second gas supply line 161.

The gas distribution line may connect the gas distributer to the respective zones of the shower head unit 140. The gas distribution line may allow the process gas distributed by the gas distributer to flow into the respective zones of the shower head unit 140.

Meanwhile, the second gas supply unit 160 may further include a second gas supply source (not shown) for supplying deposition gas.

The second gas supply source may supply the deposition gas to the shower head unit 140 for enabling anisotropic etching by protecting the side surface of the substrate W. The second gas supply source may supply C4F8 gas or C2F4 gas as the deposition gas.

The liner 170 (or wall-liner) may protect the inner surface of the housing 110 against arc discharge occurring during the impurities being produced during the excitation of the process gas and impurities being produced during the substrate processing process. The liner 170 may have a cylindrical shape opened at the upper and lower parts thereof inside the housing 110.

The liner 170 may be arranged on the inner wall of the housing 110. The liner 170 may be provided with a support ring 171 at the upper part thereof. The support ring 171 may be formed so as to protrude outward (i.e., in the first direction 10) at the upper part of the liner 170 and it may be arranged at the upper end of the housing 110 to support the liner 170.

The baffle unit 180 may exhaust the by-product of the plasma, unreacted gas, or the like. The baffle unit 180 may be installed between the inner wall of the housing 110 and the support unit 120.

The baffle unit 180 may have a ring shape and may be provided with a plurality of penetration holes penetrating in the up-down direction (i.e., third direction 30). The baffle unit 180 may control the flow of the process gas according to the number and shape of the penetration holes.

Next, a description is made of the method for controlling the gradient between the center zone and the edge zone of the substrate W by adjusting the impedances of the center electrode and the edge electrode constituting the lower electrode.

FIG. 3 is a cross-sectional view schematically illustrating a configuration of an electrostatic chuck according to an embodiment of the present disclosure.

In reference to FIG. 3, the electrostatic chuck 122 may include a dielectric plate 210, a lower electrode 220, an alternating current power source 230, a first heater 240, a second heater 250, a first filter 260, and a second filter 270.

The dielectric plate 210 may constitute the body of the electrostatic chuck 122. The dielectric plate 210 may have a circular shape and may be made of a dielectric substance.

The substrate W may be placed on the upper surface of the dielectric plate 210. The upper surface of the dielectric plate 210 may have a diameter less than that of the substrate W. The edge zone of the substrate W may be located outside the dielectric plate 210.

The power (e.g., RF power) from the power source 133 may be applied to the lower electrode 220. For example, the aforementioned power may have one or more radio frequencies (RFs).

The alternating current power source 230 may supply an alternating current signal to the first and second heaters 240 and 250. The alternating current power source 230 may supply the alternating current signal having a frequency in the range from 50 Hz to 60 Hz to heat the first and second heater 240 and 250. The alternating current power source 230 may supply the alternating current signal to the first heater 240 through the first filter 260. The alternating current power source 230 may supply the alternating current signal to the second heater 250 through the second filter 270.

The first and second heaters 240 and 250 may each heat up with the alternating current signal supplied from the alternating current power source 230. It may be possible that a plurality of first and second heaters 240 and 250 are arranged over the whole area of the dielectric plate 210 to heat the whole surface of the substrate W.

The first and second heaters 240 and 250 may be coaxially arranged in the radius direction of the dielectric plate 210 as shown in FIG. 4. Here, the heater arranged in a center zone 310 of the dielectric plate 210 is defined as the first heater 240, and the heater arranged in an edge zone 320 is defined as the second heater 250. FIG. 4 is a plan view schematically illustrating a heating member constituting an electrostatic chuck according to an embodiment of the present disclosure.

Meanwhile, it has been described that the substrate W is divided into the center zone and the edge zone and the heating member 124 includes the first and second heaters 240 and 250 corresponding respectively to the center and edge zones. However, this embodiment is not limited thereto. The heating member 124 may include three or more heaters and, in this case, the substrate W may be divided into the same number as that of the heaters.

The first filter 260 may be interposed to connect the alternating current power source 230 and the heater 240. The first filter 260 may pass the alternating current signal flowing between the alternating current power source 230 and the first heater 240 and filter out a noise signal flowing from the first heater 240 to the alternating current power source 230.

The second filter 270 may be interposed to connect the alternating current power source 230 and the second heater 250. The second filter 270 may pass the alternating current signal flowing between the alternating current power source 230 and the second heater and filter out a noise signal flowing from the second heater 250 to the alternating current power source 230.

The first filter 260 and the second filter 270 may respectively include a first capacitor 261 and a second capacitor 271. In this embodiment, it may be possible to control the gradient between the center zone and the edge zone of the substrate W using the first and second capacitors 261 and 271. A description thereof is made hereinafter.

FIG. 5 is a first exemplary view for explaining a method for controlling a gradient between a center zone and an edge zone of a substrate according to an embodiment of the present disclosure. The following description is made with reference to FIG. 5.

The first capacitor 261 may be connected to the first heater 240. The first capacitor 261 may be implemented with a variable capacitor.

The second capacitor 271 may be connected to the second heater 250. The second capacitor 271 may be implemented with a variable capacitor in the same manner as that of the first capacitor 261.

In this embodiment, it may be possible to adjust the impedances of the center zone (hereinafter, referred to as a center electrode) and the edge zone (hereinafter, referred to as an edge electrode) of the lower electrode 220 by adjusting the capacitances of the first and second capacitors 261 and 271.

For example, in the case where the etch rate is higher in the edge zone of the substrate W than in the center zone of the substrate W, it may be possible to control such that the etch rate becomes uniform across the center and edge zones of the substrate W by decreasing the impedance at the first heater 240 in such a way of increasing the capacitance of the first capacitor 261.

Here, it may also be possible to control such that the etch rate becomes uniform across the center and edge zones of the substrate W by increasing the impedance at the second heater 250 in such a way of decreasing the capacitance of the second capacitor 271.

Meanwhile, in the case where the etch rate is higher in the center zone of the substrate W than in the edge zone of the substrate W, it may be possible to control such that the etch rate becomes uniform across the center and edge zones of the substrate W by decreasing the impedance at the second heater 250 in such a way of increasing the capacitance of the second capacitor 271.

Here, it may also be possible to control such that the etch rate becomes uniform across the center and edge zones of the substrate W by increasing the impedance at the first heater 240 in such a way of decreasing the capacitance of the first capacitor 261.

Meanwhile, it may also be possible to control such that the etch rate becomes uniform across the center and edge zones of the substrate W by adjusting the voltage at the first heater 240 and the second heater 250.

Meanwhile, in FIG. 5, a line connecting the alternating current power source 230 and the first heater 240 and another line connecting the alternating current power source and the second heater 250 mean heater lines.

Meanwhile, in this embodiment, it may also be possible to measure the etch rate in the center and edge zones of the substrate W and adjust the capacitances of the first and second capacitors 261 and 271 based on a result of the measurement. In this embodiment, the substrate processing apparatus 100 may further include a controller 410 as shown in FIG. 6.

FIG. 6 is a second exemplary view for explaining a method for controlling a gradient between a center zone and an edge zone of a substrate according to another embodiment of the disclosure. The following description is made with reference to FIG. 6.

The controller 410 may adjust the capacitances of the first and second capacitors 261 and 271 based on the per-zone measured etch rates of the substrate W. For example, the controller 410 may adjust the capacitance of at least one of the first and second capacitors 261 and 271 to adjust the impedance of at least one of the center and edge electrodes.

Hereinabove, the description has been made of the electrostatic chuck 122 according to an embodiment of the present disclosure with reference to FIGS. 3 to 6. In this embodiment, it may be possible to control the gradient between the center and edge zones of the substrate W by adjusting the impedances of the center and edge electrodes constituting the lower electrode 220 in such a way of measuring the etch rate in the center and edge zones of the substrate W and adjusting the capacitances of the first and second capacitors 261 and 271 by means of the controller 410.

In this embodiment, such a configuration may achieve following effects.

First, it may be possible to improve the etch uniformity by controlling per-zone etch rates of the substrate W in such a way of adjusting the impedance of the lower electrode 220.

Second, it may be possible to facilitate implementation by using a heater zone of the electrostatic chuck 122.

Third, it may be possible to save maintenance costs of the substrate processing apparatus 100 and increase the facility usage cycle. That is, it may be possible to improve the preventive maintenance (PM) cycle.

Fourth, it may be possible to increase productivity by improving mean time between cleaning (MTBC) of the substrate processing apparatus 100.

Next, a description is made of the configuration of the substrate processing apparatus 100 in the case where the plasma generation unit 130 uses the capacitively coupled plasma (CCP) source.

FIG. 7 is a cross-sectional view schematically illustrating a configuration of the substrate processing apparatus according to another embodiment. The following description is made with reference to FIG. 7.

In reference to FIG. 7, the substrate processing apparatus 500 may include the housing 110, the support unit 120, the plasma generation unit 130, the shower head unit 140, the first gas supply unit 150, the second gas supply unit 160, the liner 170, and the baffle unit 180.

The descriptions of the housing 110, the support unit 120, the shower head unit 140, the first gas supply unit 150, the second gas supply unit 160, the liner 170, and the baffle unit 180 have been made with reference to FIG. 1 and are omitted hereinafter.

It may also be obvious that the description of the support unit 120 that has been made with reference to FIGS. 3 to 6 is identically applicable to the substrate processing apparatus 500 of FIG. 7.

Accordingly, the description is made of only the differences in configuration of the substrate processing apparatus 500 of FIG. 7 in comparison with the substrate processing apparatus 100 of FIG. 1.

In the case where the plasma generation unit 130 uses the capacitively coupled plasma (CCP) source, the shower head unit 140 may operate as the upper electrode, and the electrostatic chuck 122 may operate as the lower electrode. Here, the upper power source 131 may apply power to the shower head unit 140.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A substrate processing apparatus comprising:
a housing;
a shower head unit installed on an upper side inside the housing to introduce a process gas for processing a substrate into the housing; and
a support unit installed on a lower side inside the housing, the support unit having an electrostatic chuck on which the substrate is mounted;
wherein the electrostatic chuck includes:
a dielectric plate constituting a body;
a first heater configured to heat a first zone of the dielectric plate; a first line connecting an alternating current (AC) power source to the first heater;
a first filter installed in the first line to eliminate a noise signal flowing from the first heater to the AC power source, the first filter comprising a first capacitor connected to the first heater;
a second line directly connecting the AC power source to the first heater;
a second heater configured to heat a second zone of the dielectric plate;
a third line connecting the AC power source to the second heater;
a second filter installed in the third line to eliminate a noise signal flowing from the second heater to the AC power source, the second filter comprising a second capacitor connected to the second heater,
a fourth line directly connecting the AC power source to the second heater; and
a controller configured to control the etch rate for each zone by adjusting a capacitance of the first capacitor and a capacitance of the second capacitor, wherein when the first zone of the substrate has an etch rate higher than that of the second zone of the substrate, the controller decreases the capacitance of the first capacitor or increases the capacitance of the second capacitor to control the etch rate for each zone, and
when the second zone of the substrate has an etch rate higher than that of the first zone of the substrate, the controller increases the capacitance of the first capacitor or decreases the capacitance of the second capacitor to control the etch rate for each zone.

2. The substrate processing apparatus of claim 1, wherein at least one of the first capacitor or the second capacitor is a variable capacitor.

3. A substrate support unit comprising:
an electrostatic chuck on which a substrate to be etched using plasma is mounted;
a base installed under the electrostatic chuck to support the electrostatic chuck; and
a ring assembly installed on a side surface of the electrostatic chuck and allowing plasma to concentrate on the substrate;
wherein the electrostatic chuck includes:
a dielectric plate constituting a body;
a first heater configured to heat a first zone of the dielectric plate;
a first line connecting an alternating current (AC) power source to the first heater;
a first filter installed in the first line to eliminate a noise signal flowing from the first heater to the AC power source, the first filter comprising a first capacitor connected to the first heater;
a second line directly connecting the AC power source to the first heater;
a second heater configured to heat a second zone of the dielectric plate;
a third line connecting the AC power source to the second heater;
a second filter installed in the third line to eliminate a noise signal flowing from the second heater to the AC power source, the second filter comprising a second capacitor connected to the second heater, and
a fourth line directly connecting the AC power source to the second heater; and
a controller configured to control the etch rate for each zone by adjusting a capacitance of the first capacitor and a capacitance of the second capacitor,
wherein when the first zone of the substrate has an etch rate higher than that of the second zone of the substrate, the controller decreases the capacitance of the first capacitor or increases the capacitance of the second capacitor to control the etch rate for each zone, and
when the second zone of the substrate has an etch rate higher than that of the first zone of the substrate, the controller increases the capacitance of the first capacitor or decreases the capacitance of the second capacitor to control the etch rate for each zone.

4. The substrate support unit of claim 3, wherein at least one of the first capacitor or the second capacitor is a variable capacitor.

5. A substrate processing apparatus comprising:
a housing;
a shower head unit installed on an upper side inside the housing to introduce a process gas for processing a substrate into the housing; and
a support unit installed on a lower side inside the housing, the support unit having an electrostatic chuck on which the substrate is mounted;
wherein the electrostatic chuck includes:
a dielectric plate including a first heater configured to heat a first zone of the dielectric plate and a second heater configured to heat a second zone of the dielectric plate; and
a lower electrode to which RF power is applied, and
the substrate processing apparatus further comprising:
a lower power source applying the RF power to the lower electrode;
a first line connecting an alternating current (AC) power source to the first heater
a first filter installed in the first line and including a first variable capacitor;
a second line directly connecting the AC power source to the first heater;
a third line connecting the AC power source to the second heater;
a second filter installed in the second line and including a second variable capacitor;
a fourth line directly connecting the AC power source to the second heater;
the AC power source configured to provide a first AC signal to the first heater through the first filter and to provide a second AC signal to the second heater through the second filter; and
a controller configured to adjust at least one of capacitances of the first variable capacitor and the second variable capacitor,
wherein when the first zone of the substrate has an etch rate higher than that of the second zone of the substrate, the controller decreases the capacitance of the first variable capacitor or increases the capacitance of the second variable capacitor to control the etch rate for each zone, and
when the second zone of the substrate has an etch rate higher than that of the first zone of the substrate, the controller increases the capacitance of the first variable capacitor or decreases the capacitance of the second variable capacitor to control the etch rate for each zone.

6. The substrate processing apparatus of claim 5, wherein at least one of impedances of the first zone corresponding with a center zone and the second zone corresponding with an edge zone of the lower electrode is adjusted as the at least one of the capacitances of the first variable capacitor and the second variable capacitor is adjusted by the controller.

7. The substrate processing apparatus of claim 1, wherein the first filter comprises the first capacitor and a first inductor,
wherein the first capacitor has a first end connected to ground and a second end connected to the AC power source, and
wherein the first inductor has a first end connected to the second end of the first capacitor, and a second end connected to the first heater.

8. The substrate processing apparatus of claim 1, wherein the second line directly connects the AC power source to the first heater without an intervening component.

* * * * *